United States Patent
Nakamura et al.

(10) Patent No.: US 9,821,513 B2
(45) Date of Patent: Nov. 21, 2017

(54) METHOD FOR JOINING METALLIC MEMBER AND RESIN MEMBER TO EACH OTHER, MANUFACTURING METHOD FOR COOLER, AND COOLER

(71) Applicant: TOYOTA JIDOSHA KABUSHIKI KAISHA, Toyota-shi (JP)

(72) Inventors: Hideo Nakamura, Toyota (JP); Yoshinori Shibata, Nagoya (JP); Tooru Sugiyama, Nagakute (JP); Yu Yamamoto, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/023,233

(22) PCT Filed: Sep. 15, 2014

(86) PCT No.: PCT/IB2014/001827
§ 371 (c)(1),
(2) Date: Mar. 18, 2016

(87) PCT Pub. No.: WO2015/040466
PCT Pub. Date: Mar. 26, 2015

(65) Prior Publication Data
US 2016/0229116 A1 Aug. 11, 2016

(30) Foreign Application Priority Data
Sep. 18, 2013 (JP) ................................. 2013-193333

(51) Int. Cl.
*B29C 65/00* (2006.01)
*B29C 65/18* (2006.01)
(Continued)

(52) U.S. Cl.
CPC ............ *B29C 66/324* (2013.01); *B29C 65/18* (2013.01); *B29C 65/30* (2013.01); *B29C 65/44* (2013.01);
(Continued)

(58) Field of Classification Search
CPC .... F28F 3/02; F28F 3/12; B29C 65/44; B29C 66/0342; B29C 66/32; B29C 66/324;
(Continued)

(56) References Cited

U.S. PATENT DOCUMENTS

2007/0084552 A1* 4/2007 Watanabe ........... B29C 65/1635
156/272.8
2009/0242523 A1 10/2009 Nakamae et al.
(Continued)

FOREIGN PATENT DOCUMENTS

JP 2009-255163 A 11/2009
JP 2010-046831 A 3/2010
(Continued)

OTHER PUBLICATIONS

International Search Report dated Jan. 9, 2015, in PCT/IB2014/001827 Filed Sep. 15, 2014.

*Primary Examiner* — John Goff
(74) *Attorney, Agent, or Firm* — Oblon, McClelland, Maier & Neustadt, L.L.P.

(57) ABSTRACT

A polar functional group is added onto a surface of a metallic member. A resin member contains an adhesive functional group. The adhesive functional group and the polar functional group attract each other. A method for joining the metallic member and the resin member to each other includes: heating a junction between the metallic member and the resin member while pressing the metallic member and the resin member against each other with a first load; maintaining temperature of the junction higher than melting
(Continued)

temperature of a resin that structures the resin member while pressing the metallic member and the resin member with each other with a second load smaller than the first load; and cooling the junction to temperature lower than the melting temperature while pressing the metallic member and the resin member against each other with a third load larger than the second load.

12 Claims, 10 Drawing Sheets

(51) Int. Cl.
| | |
|---|---|
| B29C 65/30 | (2006.01) |
| B29C 65/44 | (2006.01) |
| B29C 65/48 | (2006.01) |
| B29C 65/82 | (2006.01) |
| C09J 5/02 | (2006.01) |
| C09J 5/06 | (2006.01) |
| H01L 23/473 | (2006.01) |
| H01L 21/48 | (2006.01) |
| F28F 3/02 | (2006.01) |
| F28F 3/12 | (2006.01) |
| F28F 21/00 | (2006.01) |
| F28F 21/08 | (2006.01) |
| B29L 31/34 | (2006.01) |
| F28D 21/00 | (2006.01) |

(52) U.S. Cl.
CPC ............ *B29C 65/48* (2013.01); *B29C 65/483* (2013.01); *B29C 65/8246* (2013.01); *B29C 66/028* (2013.01); *B29C 66/0342* (2013.01); *B29C 66/112* (2013.01); *B29C 66/114* (2013.01); *B29C 66/32* (2013.01); *B29C 66/342* (2013.01); *B29C 66/53461* (2013.01); *B29C 66/542* (2013.01); *B29C 66/712* (2013.01); *B29C 66/7392* (2013.01); *B29C 66/742* (2013.01); *B29C 66/81811* (2013.01); *B29C 66/81871* (2013.01); *B29C 66/8246* (2013.01); *B29C 66/8322* (2013.01); *B29C 66/9161* (2013.01); *B29C 66/91212* (2013.01); *B29C 66/91231* (2013.01); *B29C 66/91411* (2013.01); *B29C 66/91443* (2013.01); *B29C 66/91645* (2013.01); *B29C 66/91655* (2013.01); *B29C 66/91933* (2013.01); *B29C 66/91951* (2013.01); *B29C 66/92445* (2013.01); *B29C 66/92921* (2013.01); *B29C 66/961* (2013.01); *C09J 5/02* (2013.01); *C09J 5/06* (2013.01); *F28F 3/02* (2013.01); *F28F 3/12* (2013.01); *F28F 21/00* (2013.01); *F28F 21/08* (2013.01); *H01L 21/4871* (2013.01); *H01L 23/473* (2013.01); *B29C 65/4835* (2013.01); *B29C 66/71* (2013.01); *B29C 66/7422* (2013.01); *B29C 66/949* (2013.01); *B29L 2031/3481* (2013.01); *C09J 2400/163* (2013.01); *C09J 2400/166* (2013.01); *C09J 2400/226* (2013.01); *F28D 2021/0029* (2013.01); *F28F 2275/02* (2013.01); *F28F 2275/025* (2013.01); *H01L 2924/0002* (2013.01)

(58) Field of Classification Search
CPC ............ B29C 66/742; B29C 66/92445; B29C 66/92443; B29C 66/92441; B29C 66/91441; B29C 66/91443; B29C 66/91445
USPC ..................... 156/308.2–309.9, 312
See application file for complete search history.

(56) References Cited

U.S. PATENT DOCUMENTS

| | | | |
|---|---|---|---|
| 2010/0043230 A1* | 2/2010 | Bhatti | B23P 15/26 29/890.046 |
| 2010/0197882 A1 | 8/2010 | Imai et al. | |
| 2011/0139353 A1 | 6/2011 | Sugiyama et al. | |
| 2011/0165342 A1 | 7/2011 | Imai et al. | |

FOREIGN PATENT DOCUMENTS

| | | |
|---|---|---|
| JP | 2010-064397 A | 3/2010 |
| JP | 2010-173274 A | 8/2010 |
| JP | 2011-140167 A | 7/2011 |

* cited by examiner

METHOD FOR JOINING METALLIC MEMBER AND RESIN MEMBER TO EACH OTHER, MANUFACTURING METHOD FOR COOLER, AND COOLER

BACKGROUND OF THE INVENTION

1. Field of the Invention

The invention relates to a method for joining a metallic member and a resin member to each other, a manufacturing method for a cooler, and a cooler.

2. Description of Related Art

In recent years, various types of industrial products have been developed, in which a metallic member with excellent thermal conductivity, electric conductivity, extensibility, and so on, and a lightweight and inexpensive resin member are joined to each other. As a matter of course, in such industrial products, reliability of a junction between a metallic member and a resin member, which are made of different materials, becomes an issue.

A joining method is disclosed in Japanese Patent Application Publication No. 2010-173274 (JP 2010-173274 A), in which, in order to rigidly adhere a metallic member and a resin member to each other, a polar functional group is added onto a surface of the metallic member, and an adhesive modifier containing an adhesive functional group that mutually interacts with the above-mentioned polar functional group is combined with a resin that structures the resin member.

The inventor has found the following problem. In the joining method disclosed in JP 2010-173274 A, in order to promote a reaction between the polar functional group added onto the surface of the metallic member and the adhesive functional group contained in the resin, it is necessary to bring the metallic member and the resin member into contact with each other for a given period of time after heating the metallic member and the resin member to resin melting temperature or higher. Therefore, there is a problem that, when the metallic member and the resin member are kept being pressed to each other while joining, the resin protruding from the junction (or flash) is increased. Meanwhile, if the metallic member and the resin member are not pressed to each other in order to suppress generation of flash in the junction, there is a problem that air bubbles generated due to melting of the resin remain inside the resin member in the junction, thereby causing degradation of strength.

SUMMARY OF THE INVENTION

The invention provides a method for joining a metallic member and a resin member to each other, by which generation of flash in a junction is suppressed and degradation of strength due to air bubbles is suppressed.

A method for joining a metallic member and a resin member to each other according to an aspect of the invention includes the following structure. A polar functional group is added onto a surface of the metallic member. The resin member contains an adhesive functional group. The adhesive functional group and the polar functional group attract each other. The method comprises: heating a junction between the metallic member and the resin member while pressing the metallic member and the resin member against each other with first load; maintaining temperature of the junction at a first temperature higher than melting temperature of a resin that structures the resin member while pressing the metallic member and the resin member with each other with second load smaller than the first load; and cooling the junction to a second temperature lower than the melting temperature while pressing the metallic member and the resin member against each other with third load larger than the second load. With this structure, it is possible to suppress both generation of flash in the junction and degradation of strength caused by air bubbles.

The first temperature may be lower than decomposition temperature of the resin. It is thus possible to suppress deterioration due to thermal decomposition of the resin. Further, a position of a pressing part may be fixed, when maintaining temperature of the junction at the first temperature. The pressing part is a part at which the metallic member and the resin member are pressed against each other. The third load may be smaller than the first load. It is thus possible to suppress generation of flash even more. The temperature of the junction may be maintained at the first temperature for 30 seconds or longer. Thus, chemical reaction between the polar functional group added to the metallic member and the adhesive functional group contained in the resin member is promoted.

The polar functional group may be at least either one of a carboxyl group and an amino group, and the adhesive functional group may be an epoxy group. A main component of the metallic member may be aluminum, and a main component of the resin member may be polyphenylene sulfide.

A manufacturing method for a cooler according to an aspect of the invention includes the following structure. The cooler includes a metallic plate and a frame body. The metallic plate is provided with a cooling fin on a main surface on one side of the metallic plate. The frame body houses the cooling fin and is integrally provided with a coolant flow passage inside the frame body. The frame body is made of a resin. The manufacturing method comprises: adding a polar functional group onto the main surface, in which the polar functional and an adhesive functional group contained in the frame body attract each other; heating a junction between the metallic plate and the frame body while pressing the metallic plate and the frame body against each other with first load; maintaining temperature of the junction at a first temperature higher than melting temperature of a resin that structures the frame body while pressing the metallic plate and the frame body with each other with second load smaller than the first load; and cooling the junction to a second temperature lower than the melting temperature while pressing the metallic plate and the frame body against each other with third load larger than the second load. With this structure, it is possible to suppress both generation of flash in the junction and degradation of strength caused by air bubbles.

The first temperature may be lower than decomposition temperature of the resin. It is thus possible to suppress deterioration due to thermal decomposition of the resin. Further, a position of a pressing part may be fixed, when maintaining temperature of the junction at the first temperature. The pressing part is a part which the metallic plate and the frame body are pressed against each other. The third load may be smaller than the first load. It is thus possible to suppress generation of flash even more. The temperature of the junction may be maintained at the first temperature for 30 seconds or longer. Thus, chemical reaction between the polar functional group added to the metallic plate and the adhesive functional group contained in the frame body is promoted.

A cooler according to an aspect of the invention has the following structure. The cooler includes a metallic plate and a frame body. The metallic plate includes a cooling fin on a main surface on one side of the metallic plate. The frame body houses the cooling fin and is integrally provided with a coolant flow path inside the frame body. The frame body is made of a resin. The metallic plate includes a polar functional group on the main surface. The frame body includes an adhesive functional group. The adhesive functional group and the polar functional group attract each other. A junction between the metallic plate and the frame body is heated while pressing the metallic plate and the frame body against each other with first load when joining the metallic plate and the frame body to each other. Then, temperature of the junction is maintained at a first temperature higher than melting temperature of a resin that structures the frame body while pressing the metallic plate and the frame body with each other with second load smaller than the first load. The junction is cooled to a second temperature lower than the melting temperature while pressing the metallic plate and the frame body against each other with third load larger than the second load. With this structure, it is possible to suppress both generation of flash in the junction and degradation of strength caused by air bubbles.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A specific embodiment, to which the invention is applied, is explained in detail below with reference to the drawings. This should not be understood, however, that the invention is limited to the embodiment below. In order to clarify the explanation, the description and drawings below are simplified as necessary.

Figure 1:
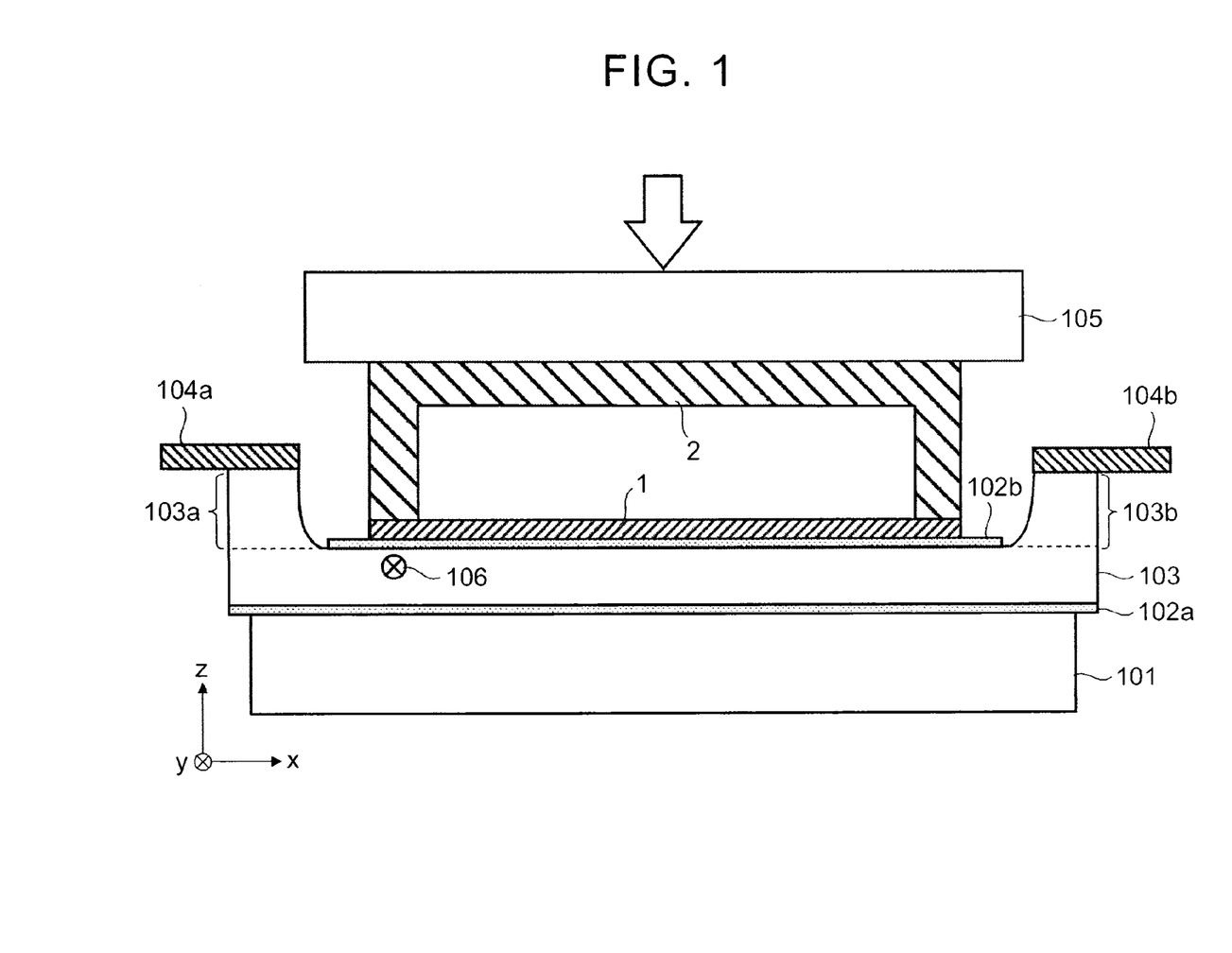
FIG. 1 is a schematic sectional view showing a joining apparatus according to an embodiment of the invention.

First of all, a joining apparatus according to the embodiment is explained with reference to FIG. 1. FIG. 1 is a schematic sectional view showing the joining apparatus according to the embodiment. The joining apparatus according to the embodiment is a joining apparatus for joining a metallic member 1 and a resin member 2.

As shown in FIG. 1, the joining apparatus according to the embodiment includes a cooling surface plate 101, insulating plates 102a, 102b, a heater 103, electrodes 104a, 104b, a pressure plate 105, and a thermocouple 106. As a matter of course, a right-handed xyz coordinate system shown in FIG. 1 is used for convenience in order to explain positional relationships. In FIG. 1, an xy plane structures a horizontal plane, a positive z-axis direction represents a vertically upward direction.

The cooling surface plate 101 is a surface plate on which the heater 103 is placed. The cooling surface plate 101 also has a function of cooling the heater 103 when energization of the heater 103 is stopped. A cooling water passage (not shown) is formed inside the cooling surface plate 101, and the cooling surface plate 101 is made of a metal with excellent thermal conductivity such as copper and copper alloy. It is preferred that the cooling surface plate 101 is placed on the horizontal plane (the xy plane). It is also preferred that an upper surface of the cooling surface plate 101, on which the heater 103 is placed, is the horizontal plane (the xy plane).

The insulating plate 102a is a sheet for insulating the heater 103 and the metallic cooling surface plate 101 from each other. Therefore, the insulating plate 102a is inserted between the heater 103 and the cooling surface plate 101. In the example shown in FIG. 1, the insulating plate 102a is provided on an entire lower surface of the heater 103. The insulating plate 102a may be fixed to the lower surface of the heater 103. Current flown in the heater 103 for heating is prevented by the insulating plate 102a from being flown into the cooling surface plate 101, thereby improving heating efficiency of the heater 103.

The insulating plate 102b is a sheet for insulating the heater 103 and the metallic member 1 from each other. Therefore, the insulating plate 102b is inserted between the heater 103 and the metallic member 1. In the example shown in FIG. 1, the insulating plate 102a is provided an almost entire upper surface of the heater 103. However, the insulating plate 102a is not provided on both end parts of the upper surface of the heater 103 in the x-axis direction, in which electrodes 104a, 104b are provided. The insulating plate 102a may be fixed to the upper surface of the heater 103. Current flown in the heater 103 for heating is prevented by the insulating plate 102b from being flown into the metallic member 1, thereby improving heating efficiency of the heater 103.

The heater 103 is a plate-like electric heating device for heating the plate-like metallic member 1. Specifically, the heater 103 heats the metallic member 1 and melts a junction of the resin member 2 placed on the metallic member 1. It is preferred that the heater 103 is, for example, an electrically heating type carbon heater. By using a carbon heater having excellent responsiveness to heating and cooling, it is possible to control temperature and heating time of the junction accurately. The thermocouple 106 is provided inside the heater 103. The thermocouple 106 measures temperature near the junction, and heating by the heater 103 is feedback-controlled.

As stated above, the heater 103 is placed on the cooling surface plate 101 through the insulating plate 102a. Meanwhile, the metallic member 1 is placed on the heater 103 through the insulating plate 102b. Further, a projection 103a is provided on the end part of the upper surface of the heater 103 on a negative side in the x-axis direction in order to provide the electrode 104a. Meanwhile, a projection 103b is provided on the end part of the upper surface of the heater 103 in a positive side in the x-axis direction in order to provide the electrode 104b. As shown in FIG. 1, the projection 103a and the projection 103b are formed so as to project from a flat part, on which the metallic member 1 is placed, on a positive side in the z-axis direction.

The electrodes 104a, 104b are electrodes for energizing the heater 103. The electrode 104a is provided on the upper surface of projection 103a of the heater 103. Meanwhile, the electrode 104b is provided on the upper surface of the projection 103b of the heater 103. Both of the electrodes 104a, 104b are provided so as to project to an outer side of the heater 103. One of the electrodes 104a, 104b is a positive electrode and the other one is a negative electrode, and either of the electrodes may be a positive electrode or a negative electrode. In other words, a direction of current flowing in the heater 103 is not limited.

The pressure plate (a pressing part) 105 is a plate-like member that is able to move in the z-axis direction, and presses the resin member 2 downwardly (to the negative side of the z-axis direction) from an upper side (the positive side in the z-axis direction). When the metallic member 1 and the resin member 2 are joined to each other, the metallic member 1 and the resin member 2 are pressed against each other by the pressure plate 105, and are thus closely adhered to each other. A servomotor controls load applied by the pressure plate 105 to the resin member 2 and displacement of the pressure plate 105 in the z-axis direction.

Next, the metallic member 1 and the resin member 2 to be joined to each other are explained with reference to FIG. 1. In the example shown in FIG. 1, the metallic member 1 is a flat plate-like member. The resin member 2 is a box-like member, the bottom surface of which is open. As shown in FIG. 1, the resin member 2, the bottom surface of which is open, is placed on the metallic member 1, and the resin member 2 and the metallic member 1 are joined to each other. Thus, a housing is obtained, in which the opening part of the resin member 2 is covered by the metallic member 1. Flash formed outside the housing that is obtained by joining the metallic member 1 and the resin member 2 is easily removed. Meanwhile, it is difficult to remove flash formed inside the housing, which is a problem. Shapes of the metallic member 1 and the resin member 2 shown in FIG. 1 are only examples, and shapes of the metallic member 1 the resin member 2 are not limited at all.

Examples of a metal that structures the metallic member 1 include aluminum, copper, nickel, tin, gold, silver, iron, magnesium, chrome, tungsten, zinc, lead, and alloy of these metals. The metallic member 1 containing aluminum as a main component is preferred.

A polar functional group is added onto a joining surface of the metallic member 1 before joining. Examples of the polar functional group include a carboxyl group, an amino group, a hydroxyl group, and an aldehyde group. The carboxyl group or the amino group is preferred as they are easily added onto a surface of a metallic part Examples of a surface treatment method for adding the polar functional group onto the junction surface of the metallic member 1 include coating treatment, frame treatment, vapor deposition treatment, and plasma treatment, in which a chemical compound containing the polar functional group, its derivative, or the like is used.

Examples of a chemical compound containing the polar functional group or its derivative include the following. Examples of a chemical compound containing the carboxyl group include, for example, acrylic acid monomer, acrylic acid polymer, copolymer of acrylic acid and maleic acid, methacrylic acid monomer, and methacrylic acid polymer. Examples of a chemical compound containing the amino group includes, for example, allylamine monomer, and allylamine polymer. Examples of derivatives of the carboxyl group and the amino group include, for example, caprolactam and polyamide.

A preferred example of a resin that structures the resin member 2 is engineering plastic such as polyphenylene sulfide (PPS), polyamide (PA), and polybuthylene terephthalate (PBT), from a perspective of thermal resistance. Of course, commodity plastic such as polyethylene (PE), polypropylene (PP), polystyrene (PS), and polyvinyl chloride (PVC) may also be used as a resin that structures the resin member 2.

An adhesive modifier containing the adhesive functional group that mutually interacts with the above-mentioned polar functional group added onto the junction surface of the metallic member 1 is combined with the resin member 2. Examples of the adhesive modifier include a chemical compound in which graft copolymer containing polyethylene, polystyrene, or the like as a main chain and styrene polymer as a side chain is denatured by the adhesive functional group, and a chemical compound in which polyethylene, polystyrene or the like is denatured by the adhesive functional group. Specific examples include denatured ethylene-styrene copolymer obtained by denaturation of copolymer of ethylene and styrene by glycidyl methacrylate, and denatured polyethylene obtained by denaturation of polyethylene by glycidyl methacrylate.

It is preferred that a content of the adhesive modifier is 5~40 parts by mass for 100 parts by mass that is a total amount of the resin and the adhesive modifier. When the content is 5 parts by mass or less, adhesiveness of the resin member 2 to the metallic member 1 is decreased. On the other hand, when the content is over 40 parts by mass, mold release characteristics when forming the resin member 2 are deteriorated. The content of 10~30 parts by mass is more preferred.

Examples of the adhesive functional group contained in the adhesive modifier include an epoxy group, a carboxyl group, an amino group, and a hydroxyl group. The adhesive functional group may also be contained in a glycidyl group. The epoxy group is preferred because the epoxy group reacts to the polar functional group easily. It is preferred that a content of the adhesive functional group in a mixture of the resin and the adhesive modifier is 0.15~0.2 mass % of the total amount of the resin and the adhesive modifier. When the value is less than 0.15 mass %, adhesiveness of the resin member 2 to the metallic member 1 is decreased. On the other hand, when the value is over 1.2 mass %, mold release characteristics when forming the resin member 2 are deteriorated. The value of 0.3~0.9 mass % is more preferred.

It is considered that adhesion on the joint interface of the metallic member 1 and the resin member 2 is caused by mutual interaction between the polar functional group added onto the surface of the metallic member 1 and the adhesive functional group contained in the resin member 2. The mutual interaction is an interaction in which atoms, electrons, and so on of the polar functional group and the adhesive functional group attract each other on the joint interface. Specific examples of the mutual interaction include the following interactions. A first example is a primary bond (such as ionic bond and covalent bond) accompanied by transfer and sharing of electrons between atoms of the polar functional group and the adhesive functional group. A second example is secondary bond (such as hydrogen bond and Van der Waals bond) in which an electron density is unevenly distributed inside the polar functional group and the adhesive functional group, and the both of the functional groups attract each other with Coulomb force.

Figure 2:
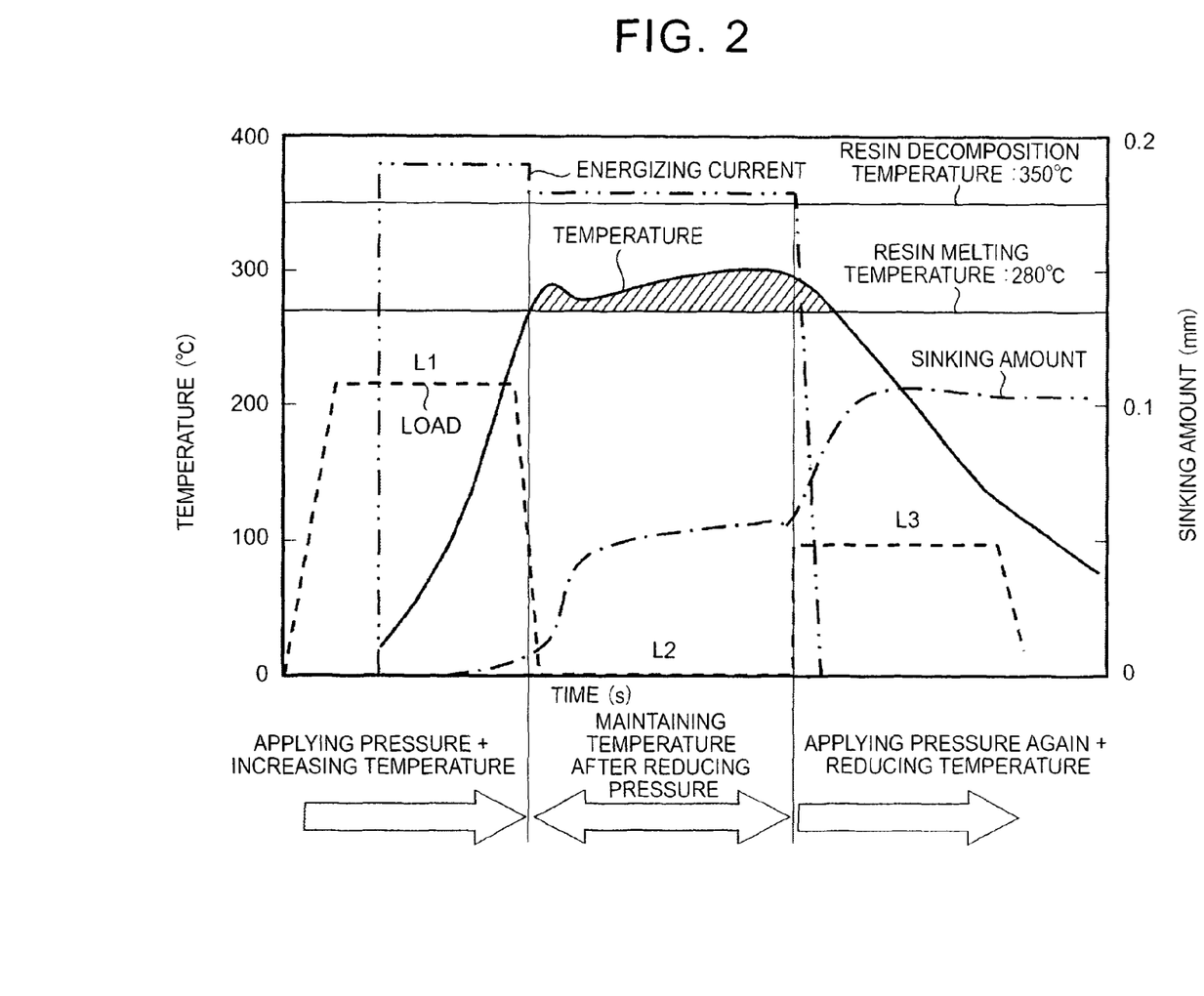
FIG. 2 is a graph showing temporal changes of temperature and sinking amount of a junction.

Next, a method according to the embodiment is explained with reference to FIG. 2. FIG. 2 is a graph showing temporal changes of temperature and a sinking amount of a junction. In FIG. 2, a horizontal axis shows time (seconds), and a vertical axis on the left shows temperature (° C.), and a vertical axis on the right side shows a sinking amount (mm). In FIG. 1, the sinking amount represents an amount of movement of, for example, the upper surface of the resin member 2 to the negative side in the z-axis direction until after joining from a state where the metallic member 1 and the resin member 2 are brought into close contact with each other before joining. The sinking amount is generated because the resin member 2 in the junction melts mainly while joining and discharged from the junction as flash. Therefore, a smaller sinking amount is preferred. FIG. 2 also shows temporal changes of load applied to the resin member 2 and current for energizing the heater 103. Units for the load and the energizing current may be arbitrary.

In the example shown in FIG. 2, an aluminum plate is used as the metallic member 1. Water-soluble polyacrylamine containing the amino group that is the polar functional group is applied on a surface of the metallic member 1 and then dried. For the resin member 2, PPS resin is used, in which polyethylene containing the epoxy group that is the adhesive functional group is combined as the adhesive modifier. The content of the adhesive modifier is 10 parts by mass for 100 parts by mass that is the total amount of the resin and the adhesive modifier. Melting temperature of the resin member 2 is 280° C. and decomposition temperature of the resin member 2 is 350° C.

As shown in FIG. 2, first of all, load L1 is applied to the resin member 2 in order to bring the metallic member 1 and the resin member 2, which are to be joined to each other, into close contact with each other. In a state where the load L1 is maintained, energization of the heater 103 starts and temperature of the junction is increased. The load L1 is an example of first load.

Next, before temperature of the junction reaches the melting temperature of the resin member 2, load applied to the resin member 2 is reduced from L1 to L2. The load L2 is an example of second load. In the example shown in FIG. 2, at a point when the temperature of the junction exceeds 200° C., load applied to the resin member 2 is reduced from L1 to L2. To be specific, a position of the pressure plate 105 in FIG. 1 is fixed. With an increase in temperature, load applied to the resin member 2 is reduced. Further, almost no load is applied due to melting of the resin in the junction. In other words, the value of L2 becomes almost 0. Thereafter, at a point when the temperature of the junction reaches the melting temperature of the resin member 2, the energizing current is reduced slightly and maintained. Thus, it is possible to maintain the temperature of the junction for a given period of time at temperature that is higher than the melting temperature of the resin member 2 and lower than the decomposition temperature of the resin member 2.

Figure 3:
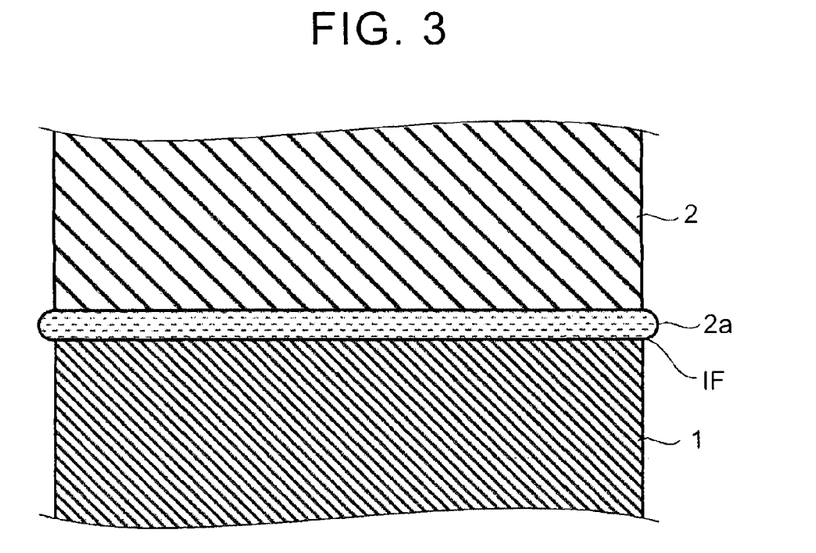
FIG. 3 is a schematic sectional view of a junction in a state where temperature of the junction is maintained higher than resin melting temperature and lower than resin decomposition temperature.

FIG. 3 is a schematic sectional view of the junction that is maintained at temperature higher than resin melting temperature and lower than resin decomposition temperature. Since the junction is maintained at temperature higher than resin melting temperature, the resin member 2 on a joint interface IF is melted (a melting part 2a) as shown in FIG. 3. Therefore, in the joint interface IF, a chemical reaction between the polar functional group added to the metallic member 1 and the adhesive functional group contained in the resin member 2 is promoted. As a result, the metallic member 1 and the resin member 2 are joined to each other rigidly. Meanwhile, by maintaining the temperature of the junction lower than the resin decomposition temperature, it is possible to prevent degradation of strength of the resin member 2 due to decomposition of the resin in the junction. Since the load L2 applied to the resin member 2 is small, the sinking amount is kept about 0.05 mm as shown in FIG. 2. Therefore, as shown in FIG. 3, generation of flash is suppressed.

As shown in FIG. 2, after the temperature of the junction is maintained for a given period of time, energization of the heater 103 is ended, and temperature reduction of the junction begins. In this cooling process, load L3, which is smaller than L1 and larger than L2, is applied to the resin member 2. The load L3 is an example of third load. Thus, the sinking amount is increased up to about 0.1 mm. In other words, flash is generated although the amount of the flash is small. However, air bubbles generated in the melting part 2a shown in FIG. 3 are crashed by application of the load L3. Therefore, it is possible to prevent degradation of strength of the junction of the resin member 2 due to air bubbles in the resin member 2.

When the load is smaller than L2, air bubbles are not crushed effectively. On the other hand, when the load is L1 or over, an amount of flash generated is increased. Preferred timing of increasing the load is when temperature begins to decrease (heating is stopped) or later. Thus, generation of flash is suppressed. Meanwhile, preferred timing of increasing the load is before the temperature of the junction becomes lower than the resin melting temperature. Thus, air bubbles are crushed effectively. The load L1-L3 does not have to be a constant value.

Figure 4:
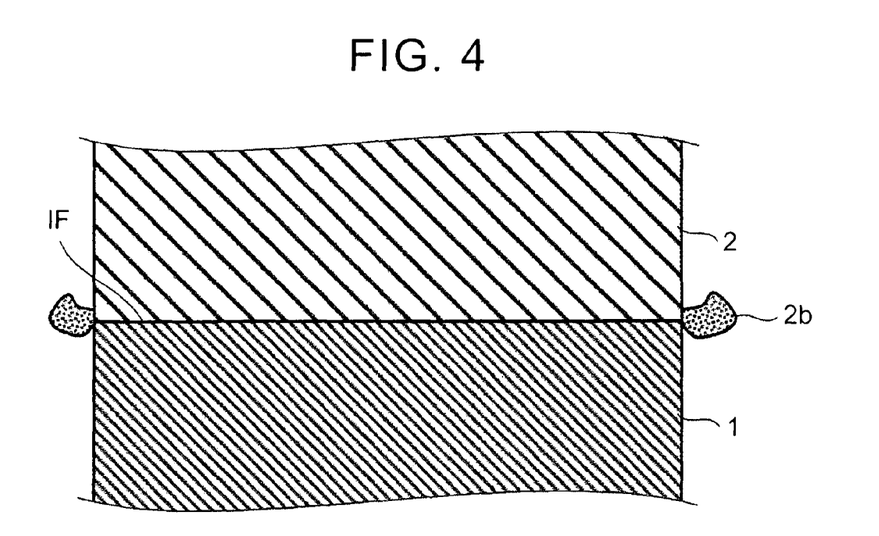
FIG. 4 is a schematic sectional view of a junction made by a method according to the embodiment of the invention.

FIG. 4 is a schematic sectional view of the junction made by the method according to the embodiment. As shown in FIG. 4, air bubbles generated in the resin member 2 near the joint interface IF disappear, and generation of flash 2b is suppressed.

Figure 5:
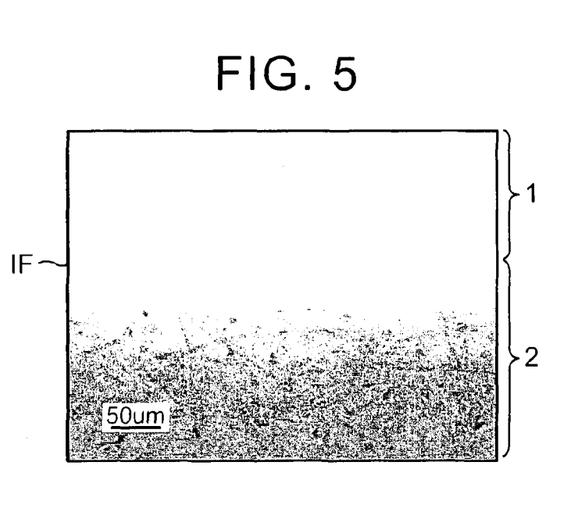
FIG. 5 is a photograph of a microstructure of the junction made by the method according to the embodiment of the invention.
Figure 6:
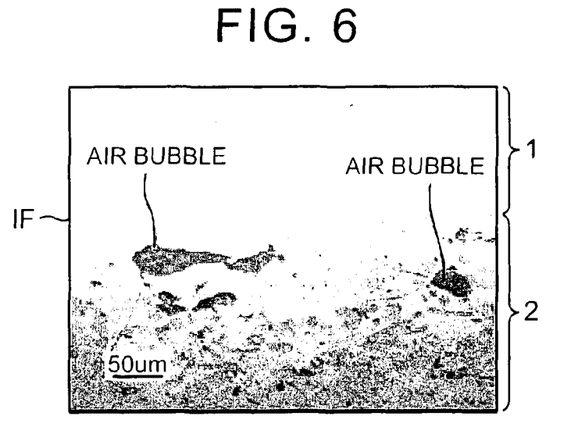
FIG. 6 is a photograph of a microstructure of a junction made by a method according to a first comparative example.

FIG. 5 is a photograph of a microstructure of the junction made by the method according to the embodiment of the invention. As shown in FIG. 5, no air bubbles are confirmed in the resin member 2 near the joint interface IF. FIG. 6 is a photograph of a microstructure of a junction made by a method according to a first comparative example. In the first comparative example 1, load is not increased from L2 to L3 and remains at L2 in the cooling process. As shown in FIG. 6, in the first comparative example, air bubbles are confirmed in a resin member 2 near a joint interface IF.

Figure 7:
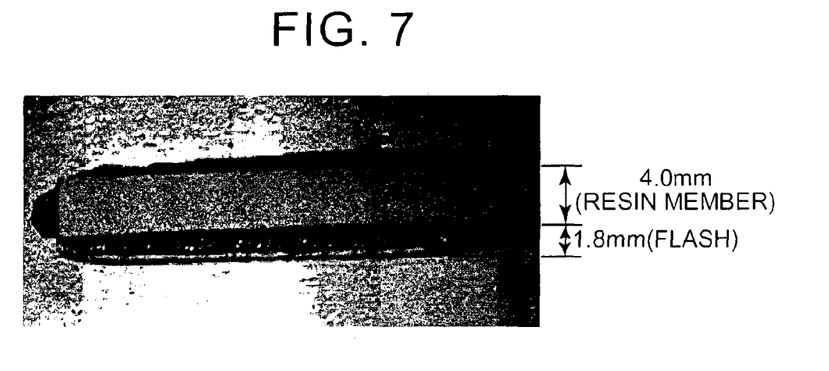
FIG. 7 is a macrophotograph of the junction made by the method according to the embodiment of the invention.

FIG. 7 is a microphotograph of the junction made by the method according to the embodiment of the invention. As shown in FIG. 7, generation of the flash 2b from the resin member 2 is suppressed. It is preferred that a projection amount of the flash 2b is a half of a width of the resin member 2 or smaller. In the example in FIG. 7, the flash 2b having the maximum projection amount of 1.8 mm is generated from the resin member 2 having a width of 4.0 mm.

Figure 8:
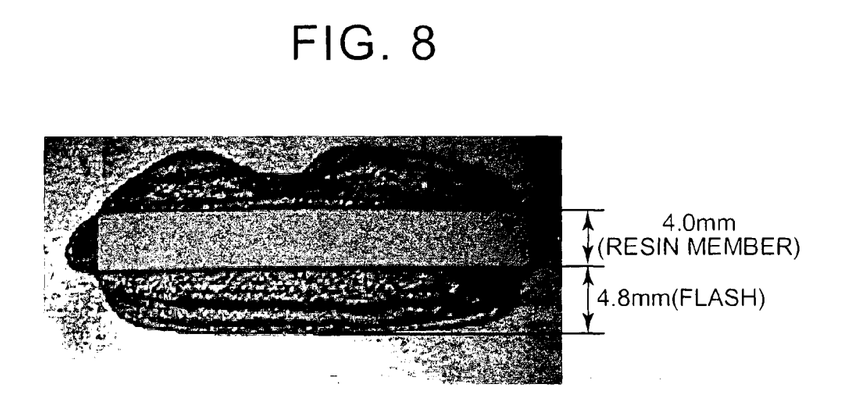
FIG. 8 is a macrophotograph of a junction made by a method according to a second comparative example 2.

FIG. 8 is a macrophotograph of a junction made by a method according to a second comparative example. In the second comparative example, the load is not reduced from L1 to L2 and remains at L1 when maintaining the temperature of the junction. As shown in FIG. 8, a large amount of flash 2b is generated from the resin member 2. In the example shown in FIG. 8, the flash 2b having the maximum projection amount of 4.8 mm is generated from the resin member 2 having a width of 4.0 mm.

Figure 9:
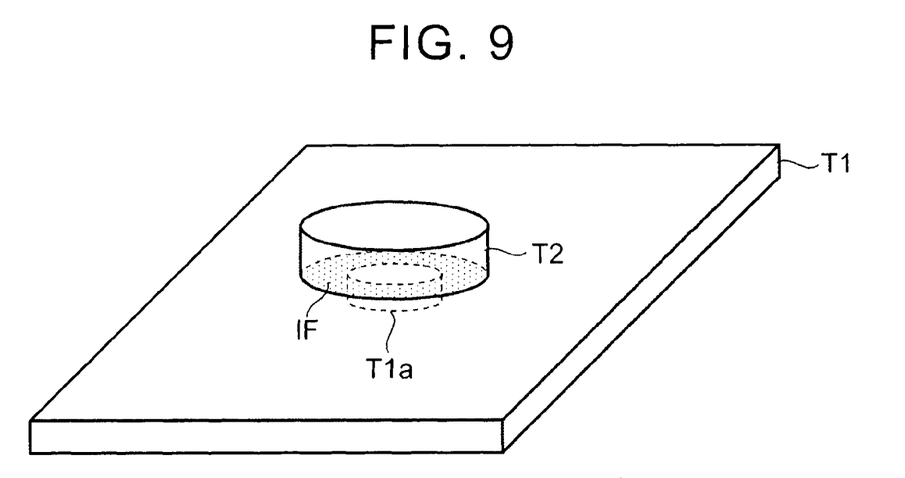
FIG. 9 is a perspective view of a test piece for a leak test.
Figure 10:
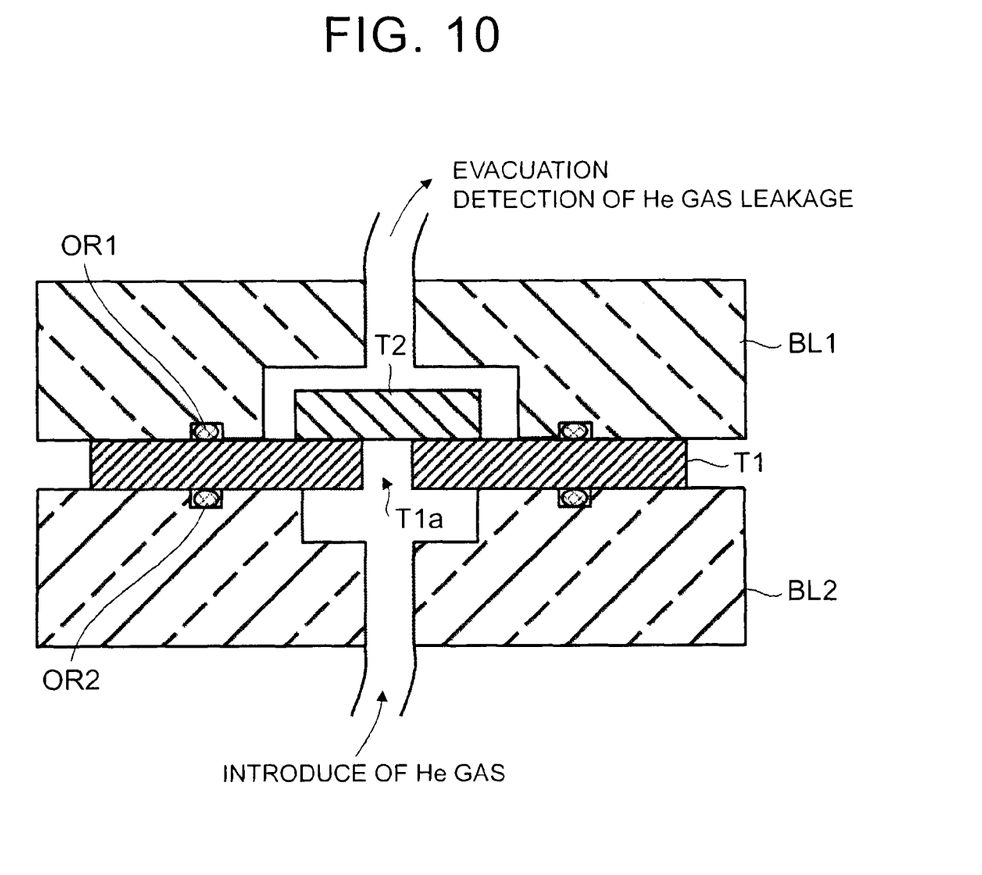
FIG. 10 is a sectional view of a testing machine for a leak test.
Figure 11:
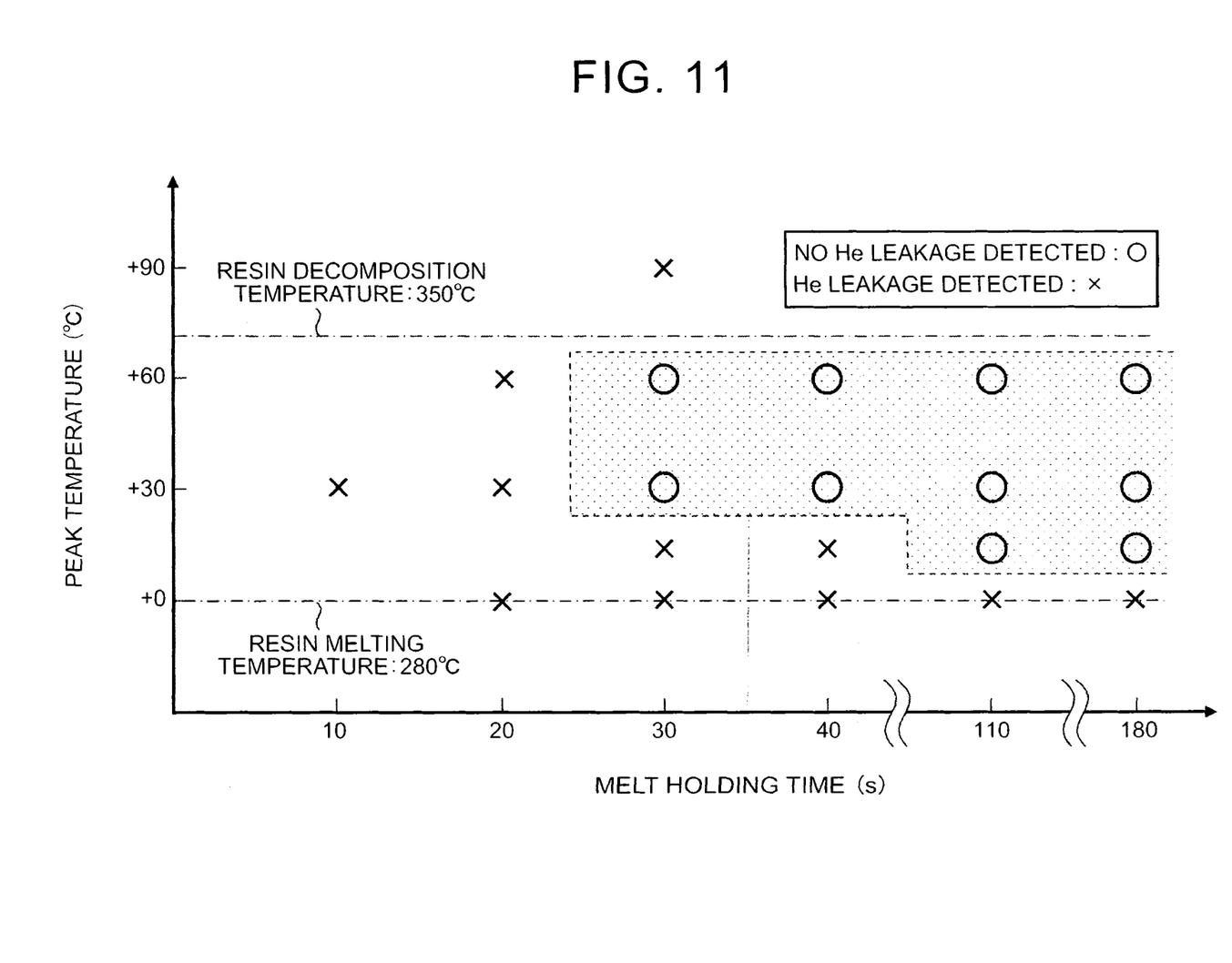
FIG. 11 is a graph showing results of helium gas leak tests conducted of a junction.

Next, with reference to FIG. 9 to FIG. 11, conditions of melt holding time and peak temperature of the junction shown by oblique lines in FIG. 2 are explained. In order to investigate the conditions, a helium gas leak test was conducted on test pieces that are joined with different melt holding time and peak temperature.

FIG. 9 is a perspective view of the test piece for a leak test. As shown in FIG. 9, the test piece for a leak test is obtained by joining an aluminum plate T1 and a PPS resin plate T2 by the method according to the embodiment, which was explained with reference to FIG. 2. The aluminum plate T1 corresponds to the metallic member 1 in FIG. 1, and the PPS resin plate T2 corresponds to the resin member 2 in FIG. 1. The disc-like PPS resin plate T2 is joined so as to cover an opening part T1a formed in a center part of the rectangular aluminum plate T1. Thus, a donut-shaped junction (a joint interface IF) is formed. Similarly to the case of FIG. 2, the amino group is added on a surface of the aluminum plate T1 as the polar functional group before joining. The epoxy group is combined with the PPS resin plate T2 as the adhesive functional group.

FIG. 10 is a sectional view of a testing machine for the leak test. As shown in FIG. 10, the testing machine for the leak test includes an upper block BL1 in which an evacuation path is provided, and a lower block BL2 in which a helium gas introduction path is provided. The aluminum plate T1 of the test piece for a leak test is sandwiched between the upper block BL1 and the lower block BL2 through O rings OR1, OR2.

When the junction of the test piece for a leak test is not sound, helium gas introduced from the lower block BL2 is discharged from the upper block BL1 through the opening part T1a and the junction of the aluminum plate T1. Therefore, helium gas leaked from the junction is detected. Meanwhile, when the junction of the test piece for a leak test is sound, helium gas introduced from the lower block BL2 is dammed up by the junction, and helium gas is not detected on a discharge side.

FIG. 11 is a graph showing results of the helium gas leak test of the junction. The horizontal axis shows time of maintaining resin melting temperature or higher (melt holding time) (s), and the vertical axis shows peak temperature (° C.) of the junction. As shown in FIG. 11, the melt holding time was changed to 10 s, 20 s, 30 s, 40 s, 110 s, and 180 s. The peak temperature was changed to ±0° C., +15° C., +30° C., +60° C., and +90° C. from the resin melting temperature (280° C.). The test result at each peak temperature is explained in order.

When the peak temperature is ±0° C., leak was confirmed in all samples subjected to the leak test with the melt holding time of 20 s, 30 s, 40 s, 110 s, and 180 s. When the peak temperature is ±0° C., the temperature of the junction is low, and it is presumed that chemical reaction between the polar functional group added to the aluminum plate T1 and the adhesive functional group contained in the PPS resin plate T2 becomes insufficient.

When the peak temperature is +15° C., leak was confirmed in samples tested with melt holding time of 30 s and 40 s. On the other hand, leak was not confirmed in samples tested with melt holding time of 110 s and 180 s. When the peak temperature is +15° C. and the melt holding time is 40 s or shorter, reaction time of the polar functional group added to the aluminum plate T1 and the adhesive functional group contained in the PPS resin plate T2 is short, and it is presumed that chemical reaction between the polar functional group and the adhesive functional group becomes insufficient. Meanwhile, when the melt holding time is 110 s or longer, it is presumed that chemical reaction between the polar functional group added to the aluminum plate T1 and the adhesive functional group contained in the PPS resin plate T2 is promoted sufficiently.

When the peak temperature is +30° C., leak was confirmed in samples tested with melt holding time of 10 s and 20 s. On the other hand, leak was not confirmed in samples tested with melt holding time of 30 s, 40 s, 110 s, and 180 s. When the peak temperature is +30° C., and the melt holding time is 20 s or shorter, reaction time of the polar functional group added to the aluminum plate T1 and the adhesive functional group contained in the PPS resin plate T2 is short, and it is presumed that chemical reaction between the polar functional group and the adhesive functional group becomes insufficient. Meanwhile, when the melt holding time is 30 s or longer, it is presumed that chemical reaction between the polar functional group added to the aluminum plate T1 and the adhesive functional group contained in the PPS resin plate T2 is promoted sufficiently.

When the peak temperature is +60° C., leak was confirmed in a sample tested with melt holding time of 20 s. Meanwhile, leak was not confirmed in samples tested with melt holding time of 30 s, 40 s, 110 s, and 180 s. Similarly to the case where the peak temperature is +30° C., when the peak temperature is +60° C., and melt holding time is 20 s and shorter, reaction time of the polar functional group added to the aluminum plate T1 and the adhesive functional group contained in the PPS resin plate T2 is short, and it is presumed that chemical reaction between the polar functional group and the adhesive functional group becomes insufficient. Meanwhile, when the melt holding time is 30 s or longer, it is presumed that chemical reaction between the polar functional group added to the aluminum plate T1 and the adhesive functional group contained in the PPS resin plate T2 is promoted sufficiently.

When the peak temperature is +90° C. the test was conducted only on a sample with melt holding time of 30 s, and leak was confirmed. When the peak temperature is +90° C., and the melt holding time of 30 s, it is presumed that chemical reaction between the polar functional group added to the aluminum plate T1 and the adhesive functional group contained in the PPS resin plate T2 is promoted sufficiently, and adhesion between the aluminum plate T1 and the PPS resin plate T2 on the joint interface IF is ensured. However, since the peak temperature is over resin decomposition temperature (+70° C.), it is presumed that resin melted in the junction is thermally decomposed, and strength of the resin in the junction is degraded.

From the above results, it is preferred that, in the method according to the embodiment, temperature of the junction is maintained higher than the resin melting temperature and lower than the resin decomposition temperature for 30 seconds or longer. It is thus possible to sufficiently promote chemical reaction between the polar functional group added to the metallic member 1 and the adhesive functional group contained in the resin member 2, and it is also possible to prevent degradation of strength of the resin member 2 due to thermal decomposition.

As explained above, in the method according to the embodiment, load applied to the resin member 2 in a process of maintaining temperature of the junction higher than the resin melting temperature (a temperature holding process) is reduced to be smaller than load applied in a temperature increasing process. Therefore, it is possible to suppress generation of flash in the junction. In the temperature increasing process, the load applied to the resin member 2 is increased to be larger than load in the temperature holding process. Thus, air bubbles generated due to melting of the resin are crushed effectively, and disappear. As a result, it is possible to suppress generation of flash in the junction and degradation of strength caused by air bubbles.

Figure 12:
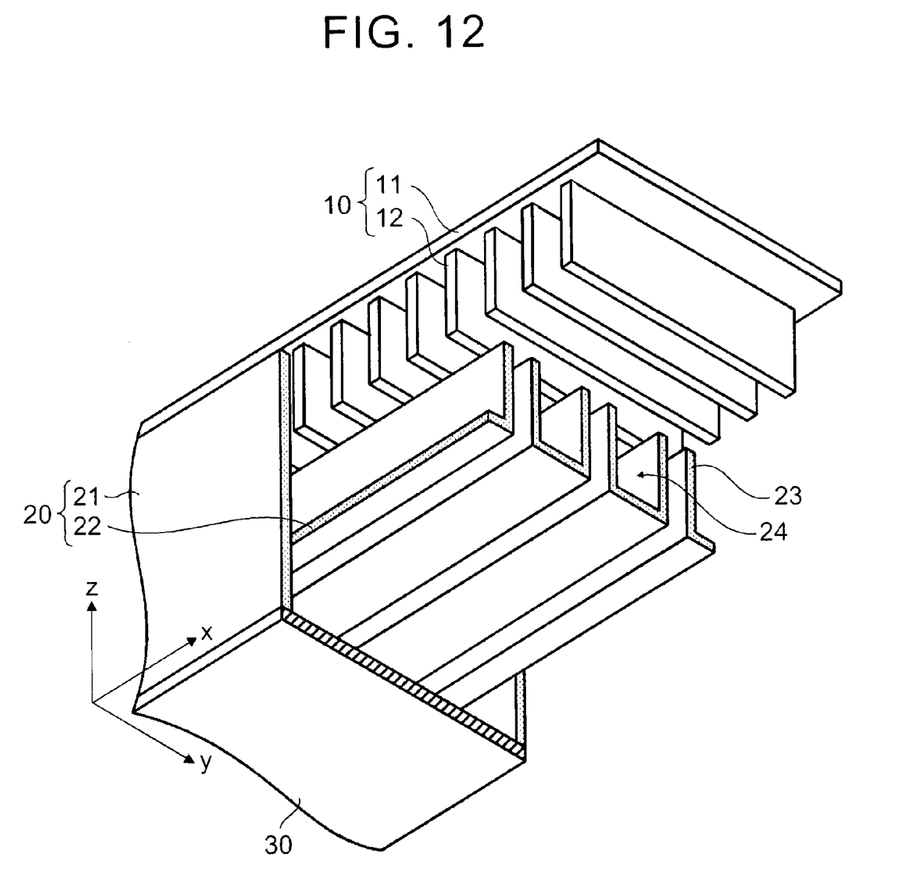
FIG. 12 is a perspective view of a cooler manufactured by applying the method according the embodiment of the invention.
Figure 13:
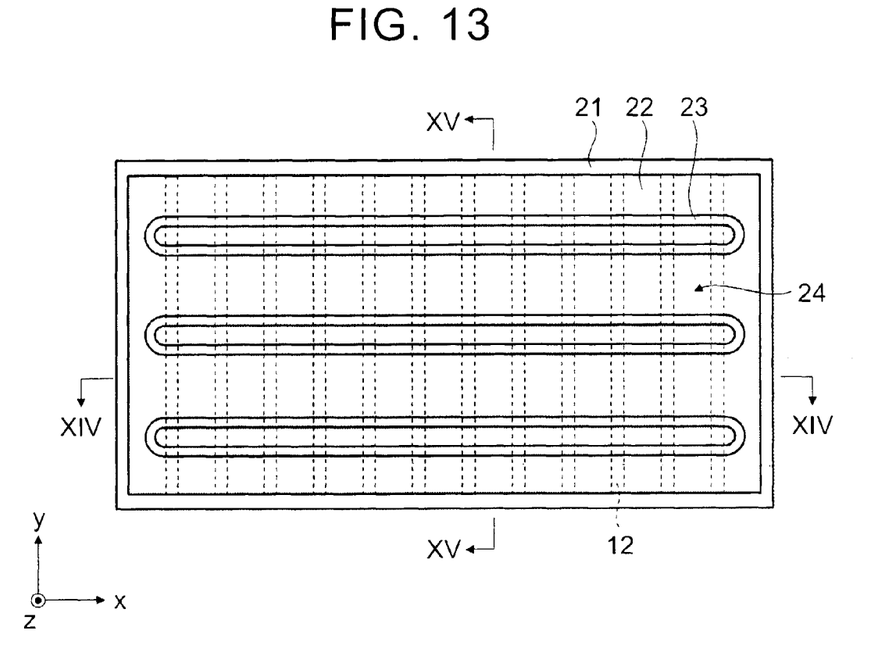
FIG. 13 is a top view of the cooler manufactured by applying the method according to the embodiment of the invention.
Figure 14:
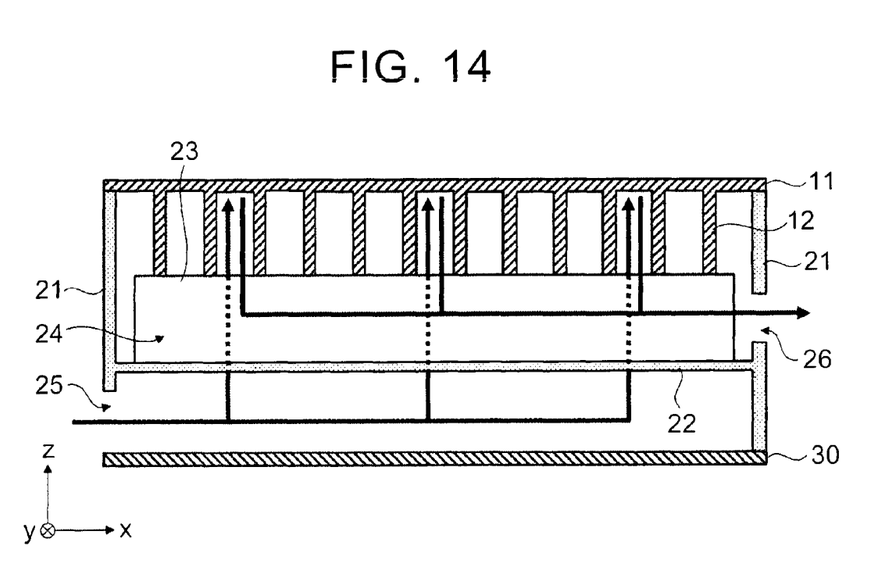
FIG. 14 is a sectional view taken along the line XIV-XIV in FIG. 13.
Figure 15:
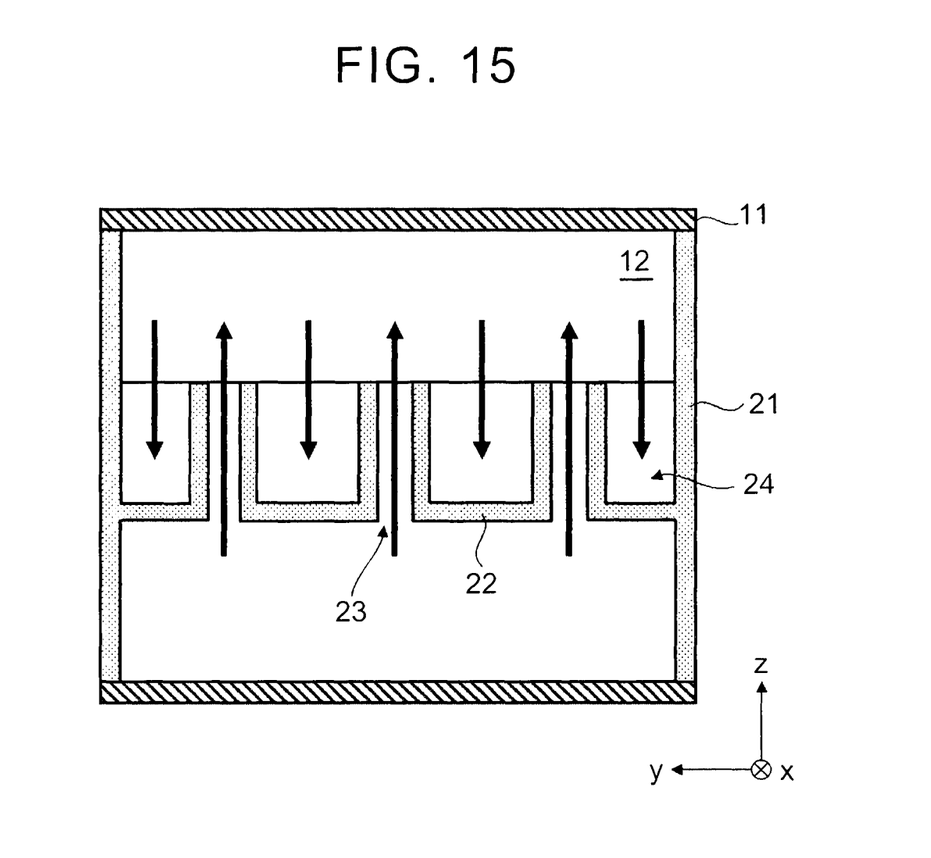
FIG. 15 is a sectional view taken along the line XV-XV in FIG. 13.

Next, a cooler manufactured by applying the method according to the embodiment is explained with reference to FIG. 12 to FIG. 15. FIG. 12 is a perspective view of a cooler manufactured by applying the method according to the embodiment. To be specific, FIG. 12 is a perspective view of the cooler observed from obliquely below. FIG. 13 is a top view of the cooler manufactured by applying the method according to the embodiment. FIG. 13 shows a state where a cooling member 10 shown in FIG. 12 is removed. FIG. 14 is a sectional view taken along the line XIV-XIV in FIG. 13. FIG. 15 is a sectional view taken along the line XV-XV in FIG. 13. A right-handed xyz coordinate system shown in FIG. 12 to FIG. 15 is used for convenience in order to explain positional relationships. In FIG. 12 to FIG. 15, an xy plane structures a horizontal plane, and a positive z-axis direction represents a vertically upward direction.

As shown in FIG. 12, the cooler according to the embodiment includes a metallic cooling member 10, a flow passage component member 20 made of a resin, and a metallic bottom plate 30. The cooling member 10 includes a top plate 11 and cooling fins 12. The flow passage component member 20 includes a frame body 21 and a partition plate 22. In FIG. 12, the flow passage component member 20 and the bottom plate 30 are partially cut, and cut surfaces are hatched.

As shown in FIG. 12, the top plate 11 is a rectangular metallic plate in which the xy plane serves as a main surface and the x-axis direction serves as a longitudinal direction. On an upper surface of the top plate 11 (the main surface on the positive side in the z-axis direction), an object to be cooled (not shown) such as a semiconductor chip is placed. Meanwhile, on a lower surface of the top plate 11 (the main surface on a negative side in the z-axis direction), the plurality of cooling fins 12 is provided so as to project downwardly (to the negative side in the z-axis direction). It is preferred that the top plate 11 and the cooling fins 12 are formed integrally with each other.

As shown in FIG. 12, the plurality of cooling fins 12 provided on the lower surface of the top plate 11 are rectangular metallic plates that have the same shape, and, in each of the cooling fins 12, the yz plane serves as a main surface, and the y-axis direction serves as a longitudinal direction. The cooling fins 12 are arranged to be almost parallel to each other and at equal intervals in the longitudinal direction of the top plate 11 (in the x-axis direction). As shown in FIG. 13, each of the cooling fins 12 is provided so that both ends of the cooling fin 12 come into contact with the frame body 21. In FIG. 13, the cooling fins 12 are shown by broken lines.

As shown in FIG. 13, the frame body 21 structures a housing of the cooler, together with the top plate 11 and the bottom plate 30. As shown in FIG. 14, a coolant supply port 25 is provided on an end surface (the yz plane) of the frame body 21 on the negative side in the x-axis direction. The supply port 25 is provided on a lower side of the partition plate 22 (on the negative side in the z-axis direction). Meanwhile, a coolant discharge port 26 is provided on an end surface (yz plane) of the frame body 21 on the positive side in the x-axis direction. The discharge port 26 is provided on an upper side (the positive side in the z-axis direction) of the partition plate 22.

As shown in FIG. 12 and FIG. 13, the partition plate 22 is a plate-like member formed integrally with the frame body 21. The partition plate 22 is provided to be parallel to the top plate 11 and the bottom plate 30. The supply passage and the discharge passage for the coolant are partitioned with the partition plate 22. To be specific, the lower side of the partition plate 22 is the supply passage, and the upper side of the partition plate 22 is the discharge passage. Nozzles 23 are provided in the partition plate 22, and the nozzles 23 project upwardly (in the positive z-axis direction) and extend in the x-axis direction. The coolant is supplied to the cooling fins 12 by the nozzles 23. Further, spaces between neighboring nozzles 23 structure exhaust passages 24. The supply passage and the exhaust passages 24 are connected with each other through the nozzles 23.

Next, a flow of a coolant is explained with reference to FIG. 14 and FIG. 15. Arrows in FIG. 14 and FIG. 15 show the flow of a coolant. First of all, as shown in FIG. 14, a coolant supplied from the supply port 25 flows to the positive side in the x-axis direction in the supply passage on the lower side of the partition plate 22. Next, as shown in FIG. 14 and FIG. 15, the coolant flows in the positive z-axis direction from the nozzles 23, and flows between the neighboring cooling fins 12. Then, as shown in FIG. 14 and FIG. 15, the coolant flows to the positive or negative side in the y-axis direction between the neighboring cooling fins 12, flows to the negative side in the z-axis direction, and then is flown into the exhaust passages 24. Finally, as shown in FIG. 14, the coolant flows in the exhaust passage 24 to the positive side in the x-axis direction, and is discharged from the discharge port 26.

Next, a manufacturing method for the cooler is explained. First of all, a lower surface of the metallic cooling member 10 and the upper surface of the flow passage component member 20 made of a resin are joined to each other by the method according to the embodiment. Specifically, a periphery of the lower surface of the top plate 11 and the upper surface of the frame body 21 are joined to each other. The top plate 11 corresponds to the metallic member 1 shown in FIG. 1, and the frame body 21 corresponds to the resin member 2 shown in FIG. 1. In FIG. 1, the top plate 11 is placed on the heater 103 so that the lower surface of the top plate 11 faces up, and the frame body 21 is placed on the top plate 11 so that the upper surface of the frame body 21 faces down. Details of the method are the same as the explanation above, and are thus omitted.

Next, the upper surface of the metallic bottom plate 30 and the lower surface of the flow passage component member 20 made of a resin are joined to each other by using the method according to the embodiment. To be specific, a periphery of the upper surface of the bottom plate 30 and the lower surface of the frame body 21 are joined to each other. Here, the bottom plate 30 corresponds to the metallic member 1 in FIG. 1, and the frame body 21 corresponds to the resin member 2 in FIG. 1. In FIG. 1, the bottom plate 30 is placed on the heater 103 so that the upper surface of the bottom plate 30 faces up, and the frame body 21 is placed on the bottom plate 30 so that the lower surface of the frame body 21 faces down. Details of the method are the same as the explanation above, and are thus omitted. As a matter of course, the bottom plate 30 and the flow passage component member 20 may be joined to each other before the cooling member 10 and the flow passage component member 20 are joined to each other.

With the manufacturing method stated above, it is possible to suppress generation of flash and degradation of strength caused by air bubbles in the junction of the cooling member 10 or the bottom plate 30 and the flow passage component member 20. In other words, it is possible to obtain a cooler with excellent cooling performance and sealability for a coolant. Flash formed outside the cooler is removed easily. On the other hand, it is difficult to remove flash formed inside the cooler, which could cause a problem in that the flash blocks a flow of a coolant.

The invention is not limited to the foregoing embodiment, and changes may be made as necessary without departing from the gist of the invention. For example, the bottom plate 30 of the cooler may be made of a resin and formed integrally with the flow passage component member 20.

The invention claimed is:

1. A method for joining a metallic member and a resin member to each other, a polar functional group added onto a surface of the metallic member, the resin member containing an adhesive functional group, the adhesive functional group and the polar functional group attracting each other, and the method comprising:
   heating a junction between the metallic member and the resin member while pressing the metallic member and the resin member against each other with first load;
   maintaining temperature of the junction at a first temperature higher than melting temperature of a resin that structures the resin member while pressing the metallic member and the resin member with each other with second load smaller than the first load; and
   cooling the junction to a second temperature lower than the melting temperature while pressing the metallic member and the resin member against each other with third load larger than the second load.

2. The method according to claim 1, wherein the first temperature is lower than decomposition temperature of the resin.

3. The method according to claim 1, wherein a position of a pressing part is fixed, when maintaining temperature of the junction at the first temperature, and
   the pressing part is a part at which the metallic member and the resin member are pressed against each other.

4. The method according to claim 1, wherein the third load is smaller than the first load.

5. The method according to claim 1, wherein the temperature of the junction is maintained at the first temperature for 30 seconds or longer.

6. The method according to claim 1, wherein
   the polar functional group is at least either one of a carboxyl group and an amino group, and
   the adhesive functional group is an epoxy group.

7. The method according to claim 1, wherein
   a main component of the metallic member is aluminum, and
   a main component of the resin member is polyphenylene sulfide.

8. A manufacturing method for a cooler, the cooler including a metallic plate and a frame body, the metallic plate being provided with a cooling fin on a main surface on one side of the metallic plate, the frame body housing the cooling fin, the frame body being integrally provided with a coolant flow passage inside the frame body, the frame body being made of a resin, and the manufacturing method comprising:
   adding a polar functional group onto the main surface of the metallic plate, in which the polar functional group and an adhesive functional group contained in the frame body attract each other;
   heating a junction between the metallic plate and the frame body while pressing the metallic plate and the frame body against each other with first load;
   maintaining temperature of the junction at a first temperature higher than melting temperature of the resin that structures the frame body while pressing the metallic plate and the frame body with each other with second load smaller than the first load; and
   cooling the junction to a second temperature lower than the melting temperature while pressing the metallic plate and the frame body against each other with third load larger than the second load.

9. The manufacturing method according to claim 8, wherein the first temperature is lower than decomposition temperature of the resin.

10. The manufacturing method according to claim 8, wherein a position of a pressing part is fixed, when maintaining temperature of the junction at the first temperature, and
    the pressing part is the part at which the metallic plate and the frame body are pressed against each other.

11. The manufacturing method according to claim 8, wherein the third load is smaller than first load.

12. The manufacturing method according to claim 8, wherein the temperature of the junction is maintained at the first temperature for 30 seconds or longer.

* * * * *